(12) United States Patent
Kim et al.

(10) Patent No.: US 7,067,237 B2
(45) Date of Patent: Jun. 27, 2006

(54) METHOD FOR FORMING PATTERN OF ONE-DIMENSIONAL NANOSTRUCTURE

(75) Inventors: Jin Young Kim, Gyeonggi-Do (KR); Chang Ho Noh, Gyeonggi-Do (KR); Euk Che Hwang, Gyeonggi-Do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/876,623

(22) Filed: Jun. 28, 2004

(65) Prior Publication Data

US 2005/0023957 A1 Feb. 3, 2005

(30) Foreign Application Priority Data

Jun. 28, 2003 (KR) .................. 10-2003-0042875
Oct. 21, 2003 (KR) .................. 10-2003-0073339

(51) Int. Cl.
*G03F 7/00* (2006.01)
(52) U.S. Cl. .................... 430/315; 977/DIG. 1
(58) Field of Classification Search ............... 430/315
See application file for complete search history.

(56) References Cited

U.S. PATENT DOCUMENTS

| 6,277,318 B1 | 8/2001 | Bower et al. .............. 264/346 |
|---|---|---|
| 6,420,092 B1 * | 7/2002 | Yang et al. ................. 430/311 |
| 6,664,727 B1 * | 12/2003 | Nakamoto .................. 313/495 |
| 6,811,957 B1 * | 11/2004 | Mau et al. .................. 430/315 |
| 6,897,603 B1 * | 5/2005 | Mao et al. ................... 313/311 |
| 6,914,381 B1 * | 7/2005 | Okai et al. ................... 313/497 |
| 2002/0183542 A1 | 12/2002 | Riondel et al. .............. 560/205 |
| 2005/0003242 A1 * | 1/2005 | No et al. ..................... 428/701 |

FOREIGN PATENT DOCUMENTS

WO  WO 01/21863 A1  3/2001

\* cited by examiner

*Primary Examiner*—Nicole Barreca

(74) *Attorney, Agent, or Firm*—Buchanan Ingersoll PC

(57) ABSTRACT

Disclosed herein are a method for forming a pattern of a one-dimensional nanostructure, and a pattern of a one-dimensional nanostructure formed by the method. The method comprises the steps of (i) coating a photocatalytic compound onto a substrate to form a photocatalytic film, and selectively exposing the photocatalytic film to light to form latent image centers for crystal growth, (ii) growing metal crystals by plating the latent pattern to form a metal pattern, and (iii) selectively growing a one-dimensional nanostructure on the metal pattern acting as a catalyst.

15 Claims, 4 Drawing Sheets

1. Coating of Photocatalyst

2. UV Exposure

3. Ag Electoless/ Electro-plating
- Room Temp
- 5~10min

3. Pd Salt solution treatment, followed by Electroless/ Electro-plating

1. Coating of Photocatalyst

<1000 A

2. UV Exposure

Active Site

3. Ag Electoless/ Electro-plating
- Room Temp
- 5~10min

3. Pd Salt solution treatment, followed by Electroless/ Electro-plating

1. Coating of Photocatalyst

2. UV Exposure

Inactive Site

3. Ag Electroless/ Electro-plating
- Room Temp
- 5~10min

3. Pd Salt solution treatment, followed by Electroless/ Electro-plating

METHOD FOR FORMING PATTERN OF ONE-DIMENSIONAL NANOSTRUCTURE

BACKGROUND OF THE INVENTION

This non-provisional application claims priority under 35 U.S.C. § 119(a) to Korean Patent Application Nos. 2003-42875 filed on Jun. 28, 2003 and 2003-73339 filed on Oct. 21, 2003, which are herein incorporated by reference.

1. Field of the Invention

The present invention relates to a method for forming a pattern of a one-dimensional nanostructure. More particularly, the present invention relates to a method for forming a pattern of a one-dimensional nanostructure which comprises the steps of (i) coating a photocatalytic compound onto a substrate to form a photocatalytic film, and selectively exposing the photocatalytic film to light to form latent image centers for crystal growth, (ii) growing metal crystals by plating the latent image centers to form a metal pattern, and (iii) selectively growing a one-dimensional nanostructure on the metal pattern acting as a catalyst pattern. It further relates to a pattern of a one-dimensional nanostructure formed by the method.

2. Description of the Related Art

In recent years, nano devices or quantum devices have drawn attention as the most promising devices available for device miniaturization, and have been recognized as next generation devices in terms of their size effects, high efficiency, low power consumption and excellent thermal stability. Studies on the applications of these devices to many fields are actively in progress. Representative applications of nano devices developed hitherto are memory devices, e.g., single-electron memory (SET) devices for quantum computing, light-emitting/-receiving optically functional devices for optical communication and optical memory, display devices and the like.

Nanostructure, a basic material for manufacturing nano devices or quantum devices, can be divided into three categories, i.e. a zero-dimensional quantum dot, a one-dimensional quantum line (or nano-line) and a two-dimensional quantum well. Among them, much research has been conducted on one-dimensional nanostructures, such as carbon nanotubes or metal nano wires, in view of diameter, length and controlling tip shape of the nanostructures, and chirality, doping, filling, introduced functional groups, individual operation/control and physical properties of materials used. There is a large possibility that one-dimensional nanostructures can be applied as materials for optically functional devices, interconnection wires and transistors.

In order to manufacture devices using such one-dimensional nanostructures, patterning of the one-dimensional nanostructures is required. Accordingly, there has been much interest in the patterning of one-dimensional nanostructures. Currently used patterning techniques are focused on the patterning a metal catalyst on a substrate, followed by growing a nanostructure formed on the patterned metal catalyst. For example, U.S. Pat. No. 6,277,318 discloses a method for forming a pattern of a metal catalyst by depositing a metal catalyst on a selected region through a shadow mask. Using this method, however, it is difficult to achieve a resolution of 100 μm or less. Furthermore, as high integration of circuits and compactness of devices are required, there have been many efforts to form high-resolution patterns. PCT Publication WO 01/021863 suggests a method for forming a fine metal pattern by an electron beam lithographic or soft lithographic technique. However, this method has not yet been put to practical use due to a number of problems. Furthermore, U.S. Patent Laid-open No. 2002-183542 describes a method including selectively growing a one-dimensional microstructure inside a porous template. However, this method involves complicated processes, and has a limitation in obtainable shapes.

Thus, there exists a need in the art for a method for forming a high-resolution pattern of a one-dimensional nanostructure wherein the pattern can be formed in a relatively simple manner.

SUMMARY OF THE INVENTION

The present inventors have earnestly and intensively conducted research to solve the above-mentioned problems. As a result, the present inventors have found that when a compound whose reactivity is changed by light, i.e. a photocatalytic compound, is coated onto a substrate to form a photocatalytic film, the photocatalytic film is selectively exposed to light to form latent image centers for crystal growth by photoreaction, metal crystals are grown by plating the latent image centers to form a metal pattern, and the metal pattern is used as a catalyst to grow a one-dimensional nanostructure, a high-resolution pattern of the one-dimensional nanostructure can be readily formed, thus accomplishing the present invention.

Therefore, it is a feature of the present invention to provide a method for easily forming a pattern of a one-dimensional nanostructure.

In accordance with the feature of the present invention, there is provided a method for forming a pattern of a one-dimensional nanostructure, comprising the steps of: (i) coating a photocatalytic compound onto a substrate to form a photocatalytic film, and selectively exposing the photocatalytic film to light to form latent image centers for crystal growth; (ii) growing metal crystals by plating the latent image centers to form a metal pattern; and (iii) selectively growing a one-dimensional nanostructure on the metal pattern acting as a catalyst.

In accordance with the feature of the present invention, there is further provided a pattern of a one-dimensional nanostructure formed by the method.

In accordance with the feature of the present invention, there is further provided a device comprising the pattern of one-dimensional nanostructure.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
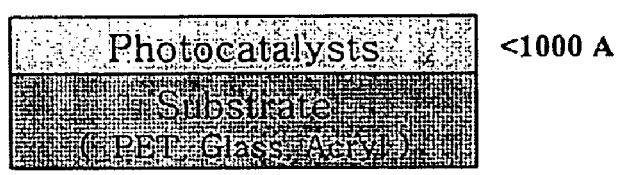
FIG. 1 is an exemplary diagram schematically showing the formation of a negative-type metal catalyst pattern, in accordance with a method for forming a pattern of a one-dimensional nanostructure according to the present invention.
Figure 1:
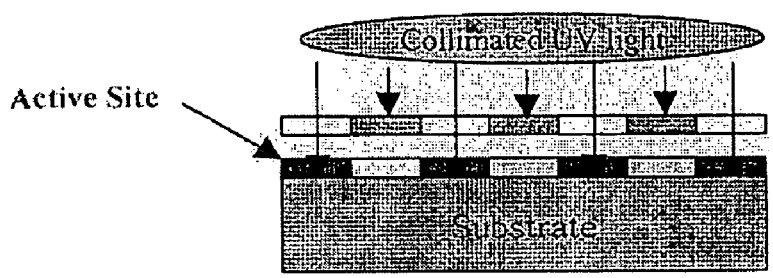
Figure 1:
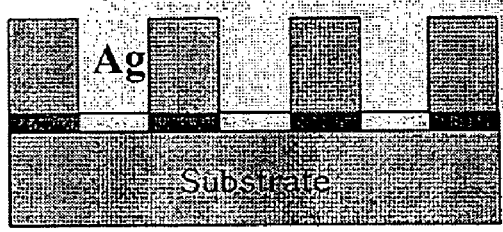
Figure 1:
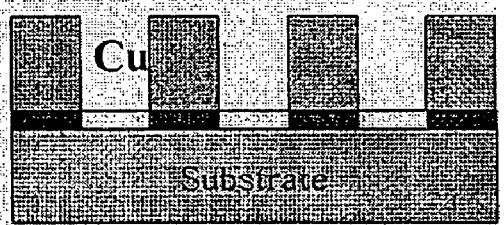
Figure 2:
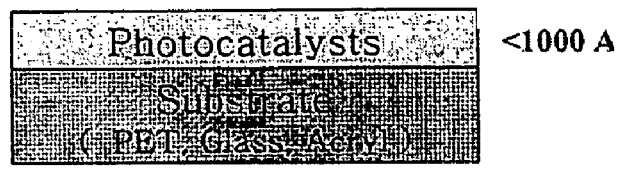
FIG. 2 is an exemplary diagram schematically showing the formation of a positive-type metal catalyst pattern, in accordance with a method for forming a pattern of a one-dimensional nanostructure according to the present invention.
Figure 2:
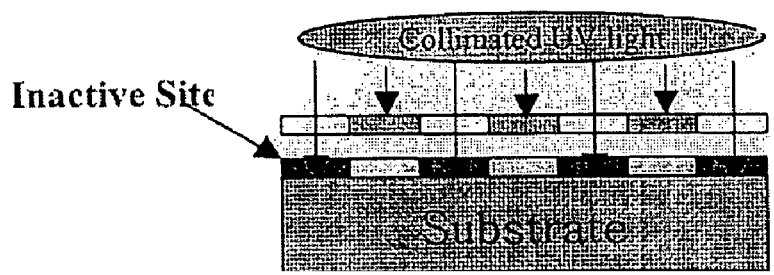
Figure 2:
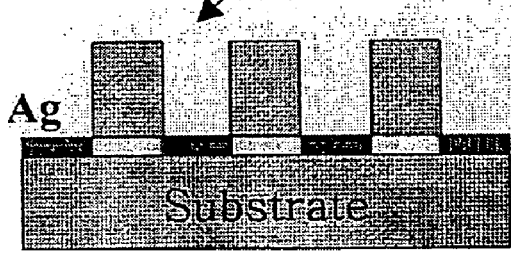
Figure 2:
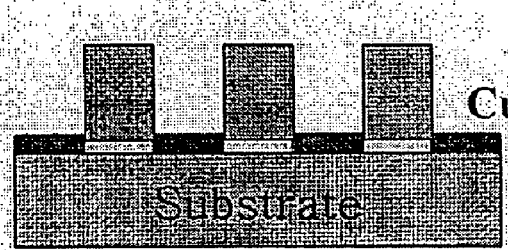

Hereinafter, the present invention will be explained in more detail, based on the respective steps.

Step (i):

First, a photocatalytic compound is coated onto a substrate to form a photocatalytic film. The photocatalytic film is then selectively exposed to light to form latent image centers of active sites and inactive sites. The latent image center plays a roll as a nucleus for crystal growth in a subsequent plating process.

The term "photocatalytic compound" as used herein refers to a compound whose characteristics are drastically changed by light. Some photocatalytic compounds (a) are inactive when not exposed to light, but their reactivity is accelerated upon being exposed to light, e.g., UV light. Alternatively, some photocatalytic compounds (b) are active when not exposed to light, but their reactivity is lost and they become inactive upon exposure to light, e.g., UV light. The photocatalytic compounds (a) are those electron-excited by photoreaction upon light exposure, thus capable of exhibiting a reducing ability. Accordingly, reduction reaction of metal ions in the exposed portion takes place and thus a negative-type latent pattern can be formed. Preferred examples of the photocatalytic compounds (a) are Ti-containing organometallic compounds which can form $TiO_x$ (in which x is a number of not higher than 2) upon exposure to light. Examples of suitable Ti-containing organometallic compounds include tetraisopropyltitanate, tetra-n-butyltitinate, tetrakis(2-ethyl-hexyl)titanate and polybutyltitanate.

Meanwhile, the photocatalytic compounds (b) are those oxidized by photoreaction upon light exposure, thus losing their activity in the exposed portion. The activity of the photocatalytic compounds (b) is maintained only in the unexposed portion, where reduction reaction of metal ions takes place and thus a positive-type latent pattern can be formed. Preferred examples of the photocatalytic compounds are Sn-containing compounds. Examples of suitable Sn-containing compounds include SnCl(OH) and $SnCl_2$.

Following dissolving the photocatalytic compound in an appropriate solvent, e.g., isopropyl alcohol, the coating of the solution onto the substrate can be conducted by a spin coating, spray coating, screen printing process or the like. The substrate usable in the present invention is not specially limited, but is preferably a transparent plastic or glass substrate. As examples of the transparent plastic substrate, acrylic resins, polyesters, polycarbonates, polyethylenes, polyethersulfones, olefin maleimide copolymers, norbornene-based resins, etc. can be mentioned. In the case where excellent heat resistance is required, olefin maleimide copolymers and norbornene-based resins are preferred. Otherwise, it is preferred to use polyester films, acrylic resins and the like as the transparent plastic substrate.

Exposure atmospherics and exposure dose for exposing the photocatalytic film are not especially limited, and can be properly selected according to the kind of the photocatalytic compound used.

The latent pattern for crystal growth is treated with a metal salt solution to form a metal particle-deposited pattern thereon, in order to effectively form a denser metal catalyst-pattern in subsequent step (ii). The deposited metal particles play a roll as catalysts accelerating metal crystal growth in a subsequent plating process. When the pattern is plated with copper, nickel or gold, the treatment with the metal salt solution is preferably carried out. As the metal salt solution, Ag salt solution, Pd salt solution or a mixed solution thereof is preferably used.

Step (ii):

The latent image centers for crystal growth formed in step (i), or if necessary, the metal particle-deposited pattern, is subjected to plating to grow metal crystals, thereby forming a final metal pattern. The plating is performed by an electroless- or electro-plating process. In the case of the metal particle-deposited pattern formed by immersing the latent pattern in the metal salt solution, the crystal growth is accelerated, since the metal particles exhibit a sufficient activity in an electroless plating solution. Accordingly, a more densely packed metal pattern can be advantageously formed.

The choice of suitable plating metals usable in the present invention is determined according to the type of nanostructure to be grown in a subsequent step for growing a one-dimensional nanostructure. The plating metal is preferably selected from the group consisting of Au, Ag, Cu, Ni, Co, Fe, Pd, Pt and alloys thereof. The metal pattern is useful as a catalyst for growing a one-dimensional nanostructure.

The electroless or electroplating is achieved by a well-known procedure. According to a common electroless plating process, the substrate on which the Pd or Ag nucleus catalyst for crystal growth is formed is immersed in a plating solution having a composition consisting of 1) a metal salt, 2) a reducing agent, 3) a complexing agent, 4) a pH-adjusting agent, 5) a pH buffer and 6) a modifying agent. The metal salt of 1) serves as a source providing metal ions. Examples of the metal salt include chlorides, sulfates and cyanides of the metal. The reducing agent of 2) acts to reduce metal ions present on the substrate. Specific examples of the reducing agent include $NaBH_4$, $KBH_4$, $NaH_2PO_2$, hydrazine, formaline and polysaccharides (e.g., glucose). Formaline and polysaccharides (e.g., glucose) are preferred. The complexing agent of 3) functions to prevent the precipitation of hydroxides in an alkaline solution and to control the concentration of free metal ions, thereby preventing the decomposition of metal salts and adjusting the plating speed. Specific examples of the complexing agent include ammonia solution, acetic acid, guanine acid, tartaric acid, chelating agents (e.g., EDTA) and organic amine compounds. Chelating agents (e.g., EDTA) are preferred. The pH-adjusting agent of 4) plays a roll in adjusting the pH of the plating solution, and is selected from acidic or basic compounds. The pH buffer of 5) inhibits the sudden change in the pH of the plating solution, and is selected from organic acids and weakly acidic inorganic compounds. The modifying agent of 6) is a compound capable of improving coating and planarization characteristics. Specific examples of the modifying agent include surfactants and adsorptive substances capable of adsorbing components interfering the crystal growth.

In a common electro-plating process, a plating solution having a composition consisting of 1) a copper salt, 2) a complexing agent, 3) a pH-adjusting agent, 4) a pH buffer and 5) a modifying agent, is used. The functions and the specific examples of the components contained in the plating solution composition are as defined above in the electroless-plating process.

Step (iii):

The metal pattern formed in step (ii) above is used as a catalyst to grow a one-dimensional nanostructure thereon. The growth of the one-dimensional nanostructure can be carried out in accordance with already known techniques using metal catalysts to grow one-dimensional nanostructures, including chemical vapor deposition (CVD), e.g., electron cyclotron resonance CVD (ECR-CVD), plasma enhanced CVD (PE-CVD), etc., physical vapor deposition (PVD), atomic layer deposition (ALD) molecular beam epitaxy (MBE), and liquid-state reaction, e.g., electroless and electro-plating, etc.

In conclusion, the method of the present invention has advantages that fine patterns of one-dimensional nanostructures can be formed in a simple manner, and one-dimensional nanostructures can be fabricated in a large area at low costs.

EXAMPLES

The constitution and effects of the present invention will now be described in more detail with reference to the following preferred examples. However, these examples are given for the purpose of illustration and are not to be construed as limiting the scope of the invention.

Formation Example 1

Formation of Negative-Type Latent Image Centers for Crystal Growth

After a solution of polybutyltitanate (3~5 wt %) in isopropanol was coated onto a soda-lime glass as a substrate by spin coating, the resulting film was dried at 150° C. for 15 minutes. UV light having a broad wavelength range was irradiated to the substrate through a photomask on which a fine mesh pattern was formed using a UV exposure apparatus (Oriel, U.S.A). After exposure, the substrate was immersed in a solution of 0.6 g of $PdCl_2$ and 1 ml of HCl in 1 l of water to deposit Pd particles on the surface of the exposed portion. As a result, a negative latent image center composed of Pd, acting as a nucleus for crystal growth, was formed.

Formation Example 2

Formation of Negative-Type Latent Image Centers for Crystal Growth

The procedure of Formation Example 1 above was repeated to form a negative-type latent image center for crystal growth, except that the treatment with Pd salt solution was not carried out.

Formation Example 3

Formation of Positive-Type Latent Image Centers for Crystal Growth

First, 22 g of $SnCl_2$ was dissolved in 1 l of water and then 10 ml of hydrochloric acid was added thereto to obtain a solution. After a soda-lime glass as a substrate was immersed in the solution for 1 minute, the resulting substrate was dried at 100° C. for 2 minutes to form a photocatalytic compound-coated substrate having a thickness of 50 nm or less. UV light having a broad wavelength range was irradiated to the substrate through a photomask on which a fine mesh pattern was formed using a UV exposure apparatus (Oriel, U.S.A). After exposure, the substrate was immersed in a solution of 0.6 g of $PdCl_2$ and 1 ml of HCl in 1 l of water to deposit Pd particles on the surface of the unexposed portion. As a result, a positive latent image center composed of Pd, acting as a nucleus for crystal growth, was formed.

Formation Example 4

Formation of Positive-Type Latent Image Centers for Crystal Growth

The procedure of Formation Example 3 above was repeated to form a positive-type latent image center acting as a nucleus for crystal growth, except that the treatment with Pd salt solution was not carried out.

Example 1

Formation of Negative-Type Copper Wiring

The pattern formed in Formation Example 1 above was immersed in an electroless copper plating solution to selectively grow crystals of a copper wire. At this time, the electroless copper plating solution was prepared so as to have the composition indicated in Table 1(a) below. The basic physical properties of the copper wiring are shown in Table 2 below. The thickness of the copper wiring was measured using α-step (manufactured by Dektak), and the specific resistance was measured using a 4-point probe. The resolution was determined using an optical microscope, and the adhesive force was confirmed by a scotch tape peeling test.

Example 2

Formation of Negative-Type Silver Wiring

The pattern formed in Formation Example 2 above was immersed in an electroless silver plating solution to selectively grow crystals of a silver wire. At this time, the electroless silver plating solution was prepared so as to have the composition indicated in Table 1(b) below. The basic physical properties of the silver wiring are shown in Table 2 below.

Example 3

Formation of Positive-Type Copper Wiring

The pattern formed in Formation Example 3 above was immersed in an electroless copper plating solution to selectively grow crystals of a copper wire. At this time, the electroless copper plating solution was prepared so as to have the composition indicated in Table 1(a) below. The basic physical properties of the copper wiring are shown in Table 2 below.

Example 4

Formation of Positive-Type Silver Wiring

The pattern formed in Formation Example 4 above was immersed in an electroless silver plating solution to selectively grow crystals of a silver wire. At this time, the electroless silver plating solution was prepared so as to have the composition indicated in Table 1(b) below. The basic physical properties of the silver wiring are shown in Table 2 below.

Example 5

Formation of Negative-Type Nickel Wiring

The substrate prepared in Formation Example 1 above was immersed in an electroless nickel plating solution to selectively grow crystals of a Ni wire. The electroless nickel plating solution was commercially available under the trade name of NIMUDEN NPR-4 manufactured by UYEMURA Co. Ltd. The plating was carried out 80° C. for 2 minutes. The basic physical properties of the nickel pattern are listed in Table 2 below.

Example 6

Formation of Positive-Type Nickel Wiring

The procedure of Example 5 was repeated to form a nickel pattern, except that the substrate prepared in Formation Example 3 was used. The basic physical properties of the nickel pattern are listed in Table 2 below.

TABLE 1

| (a) Copper plating solution | (b) Silver plating solution |
| --- | --- |
| Copper sulfate 3.5 g | Silver nitrate 4 g |
| Rochelle salt 8.5 g | Glucose 45 g |
| Formaline (37%) 22 ml | Rochelle salt 4 g |
| Thiourea 1 g | Polyvinyl alcohol 1.5 g |
| Ammonia 11 | Ethanol 100 ml |
| 35° C./5 min. | 40° C./30 sec. |

TABLE 2

| Example No. | Film thickness (Å) | Specific Resistance (µohm-cm) | Resolution (µm) | Adhesive force |
| --- | --- | --- | --- | --- |
| Example 1 | 2865 | 2.7 | <5 | Pass (3 M tape test) |
| Example 2 | 2517 | 2.3 | <5 | Pass (3 M tape test) |
| Example 3 | 2680 | 3.1 | <5 | Pass (3 M tape test) |
| Example 4 | 2650 | 2.6 | <5 | Pass (3 M tape test) |
| Example 5 | 1783 | 12.1 | 10 | Pass (3 M tape test) |
| Example 6 | 1814 | 15 | 10 | Pass (3 M tape test) |

Example 7

Fabrication of One-Dimensional Nanostructure Using Nickel Wiring

Figure 3:
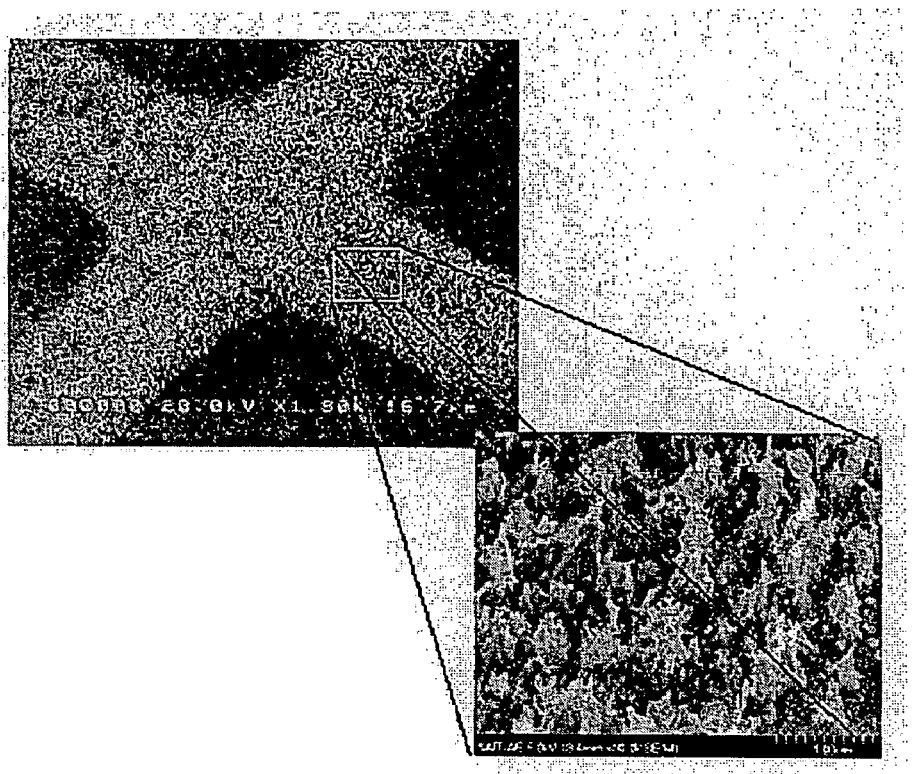
FIG. 3 is an electron microscopic image of pattern of carbon nanotubes formed in Example 7 of the present invention.

A pattern of carbon nanotubes was formed using the nickel pattern formed in Example 5 as a catalyst by a CVD technique under the following conditions: Apparatus: ECR-CVD, Gases: $CH_4/Ar=50/10$ sccm, Pressure: 10 mTorr, MW power: 800 W, Substrate temperature: about 400° C., DC bias applied to substrate: −100V, Growth time: 10 min. An electron microscopic image of the aligned carbon nanotubes is shown in FIG. 3.

Example 8

Fabrication of One-Dimensional Nanostructure Using Nickel Wiring

Figure 4:
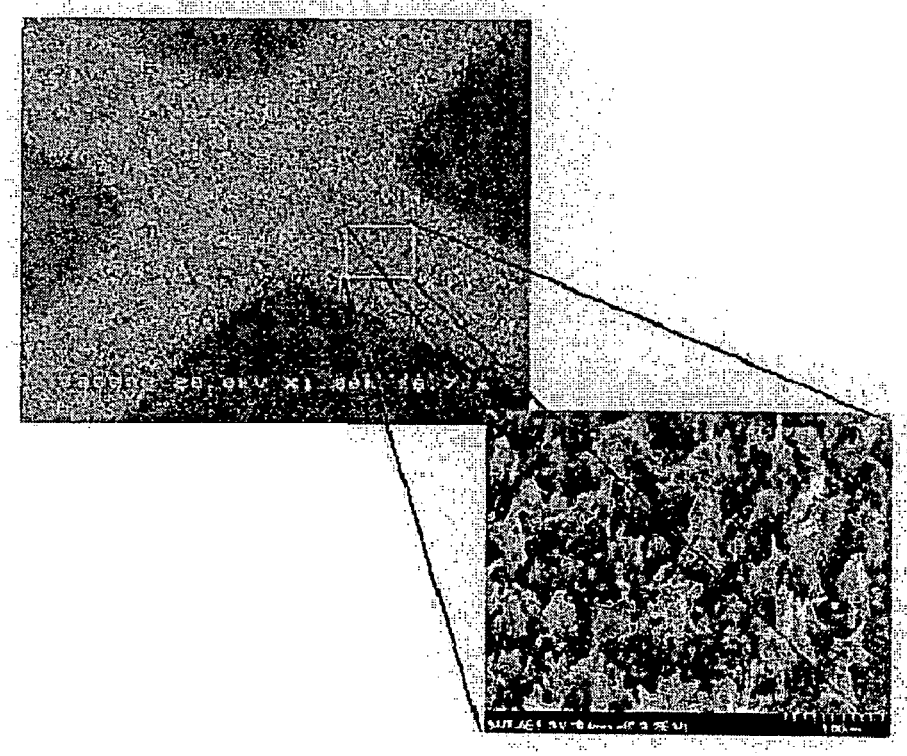
FIG. 4 is an electron microscopic image of a pattern of carbon nanotubes formed in Example 8 of the present invention.

A pattern of carbon nanotubes was formed using the nickel pattern formed in Example 5 as a catalyst by a CVD technique under the following conditions: Apparatus: PE-CVD, Gases: $NH_3$ 300 sccm/$C_2H_2$ 70 sccm, Pressure: 4 Torr, Plasma power: 500 W, Substrate temperature: about 500° C., Growth time: $NH_3$ plasma etching (3 min.), $C_2H_2+NH_3$ plasma growth (20 min.). An electron microscopic image of the aligned carbon nanotubes is shown in FIG. 4.

Example 9

Figure 5:
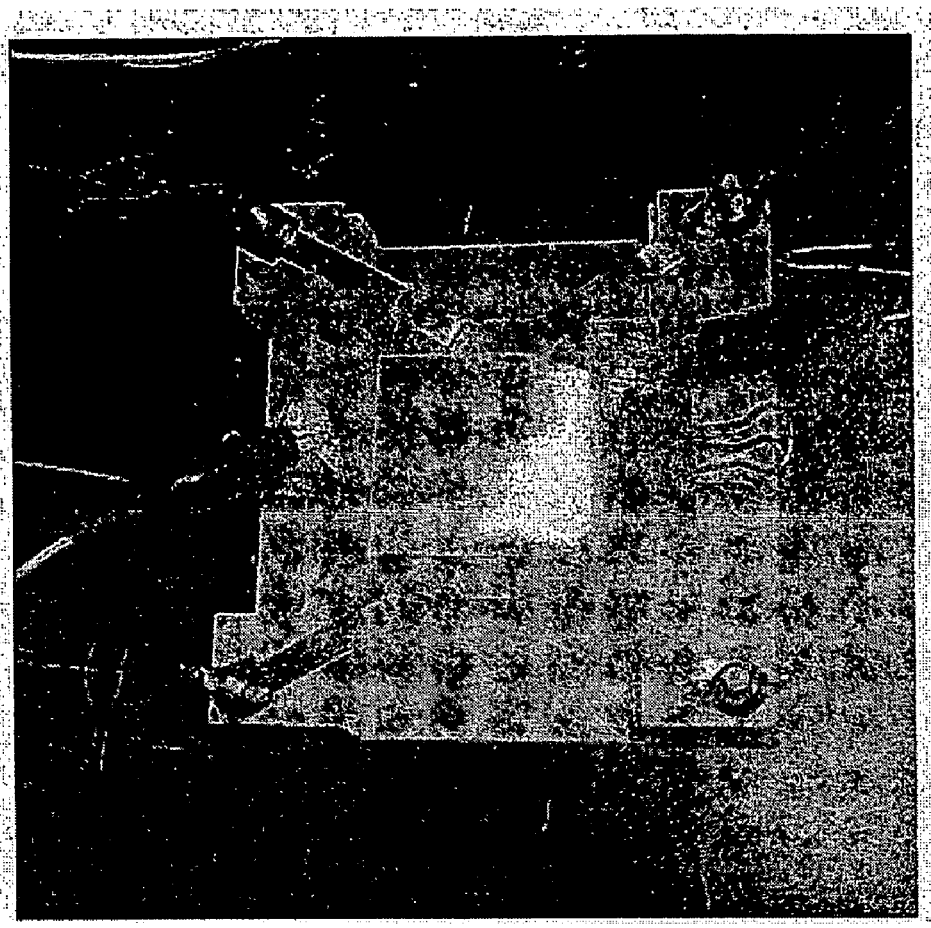
FIG. 5 is a photograph of an FED device manufactured in Example 9 of the present invention.
Figure 6:
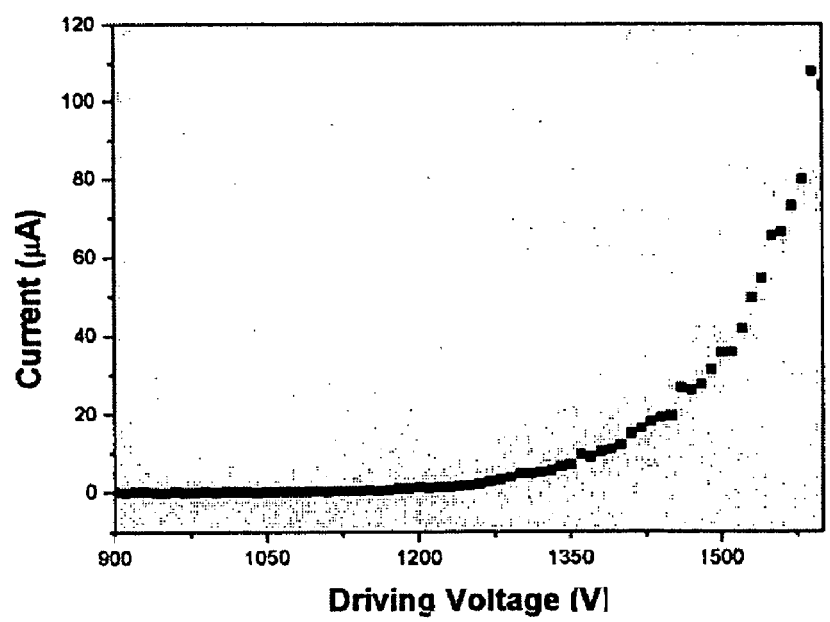
FIG. 6 is a graph showing the current-driving voltage (IV) characteristic of an FED device manufactured in Example 9 of the present invention.

An FED device was manufactured using the pattern of carbon nanotubes formed in Example 7 under the conditions shown in Table 3 below (see, FIG. 5). A current-voltage (IV) graph showing the driving characteristics of the FED device is shown in FIG. 6.

TABLE 3

| Substrate | Heat-resistant glass |
| --- | --- |
| Metal catalyst | Ni (thickness: 10 nm) |
| Carbon nano-tube (CNT) | PECVD technique |
| Fluorescent materials | ZnS: Cu, Al |
| Spacer | 400 µm |

According to the method of the present invention, since a metal pattern having excellent catalytic activity can be formed without involving a sputtering process, a photolithographic process and an etching process, a high-resolution pattern of one-dimensional nanostructures can be formed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a pattern of a one-dimensional nanostructure, comprising the steps of:
   (i) coating a photocatalytic compound onto a substrate to form a photocatalytic film, and selectively exposing the photocatalytic film to light to form latent image centers for crystal growth;
   (ii) growing metal crystals by plating the latent pattern to form a metal pattern; and
   (iii) selectively growing a one-dimensional nanostructure on the metal pattern acting as a catalyst.

2. The method according to claim 1, further comprising the step of, prior to step (ii), treating the latent image centers in step (i) with a metal salt solution to form a metal particle-deposited pattern thereon.

3. The method according to claim 2, wherein the metal salt solution is palladium salt solution, silver salt solution or a mixed solution thereof.

4. The method according to claim 2, wherein the photocatalytic compound is (a) a compound electron-excited by light upon light exposure, thus exhibiting activity; or (b) a compound losing its activity by light upon light exposure.

5. The method according to claim 4, wherein the compound (a) exhibiting activity by light is a Ti-containing organometallic compound which forms $TiO_x$ (in which x is a number of not higher than 2) upon exposure to light, and the compound (b) losing its activity by light is a Sn-containing compound.

6. The method according to claim 5, wherein the Ti-containing organometallic compound is selected from the group consisting of tetraisopropyltitanate, tetra-n-butyltitinate, tetrakis(2-ethyl-hexyl)titanate and polybutyltitanate; and the Sn-containing compound is SnCl(OH) or $SnCl_2$.

7. The method according to claim 2, wherein the plating in step (ii) is performed by an electroless- or electro-plating process.

8. The method according to claim 7, wherein the plating metal is selected from the group consisting of Cu, Ni, Ag, Au and alloys thereof.

9. The method according to claim 1, wherein the fabrication and growth of the one-dimensional nanostructure in step (iii) are carried out by chemical vapor deposition (CVD), physical vapor deposition (PVD), atomic layer deposition (ALD), or molecular beam epitaxy (MBE), or liquid-state reaction selected from electroless and electro-plating.

10. The method according to 1, wherein the fabrication and growth of the one-dimensional nanostructure in step (iii) are carried out by chemical vapor deposition, wherein the chemical vapor deposition is electron cyclotron resonance CVD (ECR-CVD) or plasma enhanced CVD (PE-CVD).

11. The method according to claim 1, wherein the photocatalytic compound is (a) a compound electron-excited by light upon light exposure, thus exhibiting activity; or (b) a compound losing its activity by light upon light exposure.

12. The method according to claim 11, wherein the compound (a) exhibiting activity by light is a Ti-containing organometallic compound which forms $TiO_x$ (in which x is a number of not higher than 2) upon exposure to light, and the compound (b) losing its activity by light is a Sn-containing compound.

13. The method according to claim 12, wherein the Ti-containing organometallic compound is selected from the group consisting of tetraisopropyltitanate, tetra-n-butyltitinate, tetrakis(2-ethyl-hexyl)titanate and polybutyltitanate; and the Sn-containing compound is SnCl(OH) or $SnCl_2$.

14. The method according to claim 1, wherein the plating in step (ii) is performed by an electroless- or electro-plating process.

15. The method according to claim 14, wherein the plating metal is selected from the group consisting of Cu, Ni, Ag, Au and alloys thereof.

* * * * *